(12) United States Patent
Schroeder et al.

(10) Patent No.: US 7,064,543 B2
(45) Date of Patent: Jun. 20, 2006

(54) METHOD OF VERIFYING THE SYNTHESIS OF ORGANIC MOLECULES USING NUCLEAR MAGNETIC RESONANCE SPECTROSCOPY

(75) Inventors: Harald Schroeder, Weil am Rhein (DE); Klaus-Peter Neidig, Ettlingen (DE)

(73) Assignee: Bruker Biospin GmbH, Rheinstetten (DE)

( * ) Notice: Subject to any disclaimer, the term of this patent is extended or adjusted under 35 U.S.C. 154(b) by 228 days.

(21) Appl. No.: 10/639,436

(22) Filed: Aug. 13, 2003

(65) Prior Publication Data

US 2004/0096905 A1    May 20, 2004

Related U.S. Application Data

(63) Continuation of application No. 09/888,596, filed on Jun. 26, 2001, now abandoned, which is a continuation-in-part of application No. 09/422,639, filed on Oct. 22, 1999, now abandoned.

(30) Foreign Application Priority Data

Oct. 26, 1998   (DE) ................................ 198 49 231

(51) Int. Cl.
   *G01V 3/00*    (2006.01)
(52) U.S. Cl. ........................... 324/307; 324/12; 706/48
(58) Field of Classification Search .................. None
   See application file for complete search history.

(56) References Cited

OTHER PUBLICATIONS

Bleicher, K.; Lin, M.; Shapiro, M. J.; Wareing, J. R. "Diffusion Edited NMR: Screening Compound Mixtures by Affinity NMR to Detect Binding Ligands to Vancomycin" J. Org. Chem. Oct. 22, 1998, 63, 8486-8490.*
Oschkinat, H.; Croft, D. "Automated Assignment of Multidimensional Nuclear Magnetic Resonance Spectra" Methods in Enzymology 1994, 239, 308-318.*
Braun, S.; Kalinowski, H. -O. Berger, S. 150 and More Basic NMR Experiments. New York: Wiley-VCH, Jun. 1998, pp. 401-403 and 497-499.*
Newkome, G. R.; Weis, C. D.; Moorefield, C. N.; Baker, G. R.; Childs, B. J.; Epperson J. Isocyanate-Based Dendritic Building Blocks: Combinatorial Tier Construction and Macromolecular-Property Modification Angew. Chem. Int. Ed. Feb. 1998, 37(3), 307-310.*
Will, M.; Fachinger, W.; Richert, J. R. "Fully Automated Structure Elucidation—A spectroscopist's Dream Comes True" J. Chem. Inf. Compout. Sci. 1996, 36, 221-227.*
Neidig, K. P.; Saffrich, R.; Lorenz, M.; Kalbitzer, H. R. "Cluster Analysis and Multiplet Pattern Recognition in Two-Dimensional NMR spectra" J. Magn. Reson. 1990, 89, 543-552.*
Kleywegt, G.; Boelens, R.; Kaptein, R. "A versatile Approach towad the Partially Automatic Recognition of Cross Peaks in 2D 1H NMR Spectra" J. Magn. Reson. 1990, 88, 601-608.*
Jurd, L. "Synthesis of 4-phenyl-2H-1-benzopyranes" J. Heterocycl. Chem. 1991, 28, 983-986.*
Ugi, I.; Domling, A.; Ebert, B. "Combinatorial Chemistry of Multicomponent Reactions" in Combinatorial Chemistry. Ed. Jung, G.; Weinheim Germany: Wiley-VCH. 1999, pp. 126-165.*
Braun, S.; Kalinowski, H. -O. Berger, S. 150 and More Basic NMR Experiments. New York: Wiley-VCH, Jun. 1998, p. 401.*

(Continued)

*Primary Examiner*—Andrew Wang
*Assistant Examiner*—Jon D. Epperson
(74) *Attorney, Agent, or Firm*—Paul Vincent (57) ABSTRACT

A NMR method to verify the presence of organic molecular compounds consisting of repetitive occurring individual structures is presented. The method comprises the steps of assigning structure codes to the selected compounds, in accordance with the respective starting compounds used, measuring multi-dimensional NMR spectra from at least some of the compounds, uniquely assigning signal groups of NMR spectra to the individual structures, checking the NMR spectra of the compounds for the presence of all assigned signal groups, and characterizing a particular compound as being TRUE if the check of its particular combination of structures yields the result that the signal groups of structures contained in its total code had been observed. The method permits rapid and accurate verification of the presence of compounds having repetitive structures such as those produced in combinatorial chemistry.

19 Claims, 12 Drawing Sheets

OTHER PUBLICATIONS

Newkome, G. R.; Weis, C. D.; Moorefield, C. N.; Baker, G. R.; Childs, B. J.; Epperson J. Isocyanate-Based Dendritic Building Blocks: Combinatorial Tier Construction and Macromolecular-Property Modification Angew. Chem. Int. Ed. Feb. 1998, 37(3), 307-3.*

Will, M.; Fachinger, W.; Richert, J. R. "Fully Automated Structure Elucidation—A spectroscopist's Dream Comes True" J. Chem. Inf. Compout. Sci. 1996, 36, 221-227.*

Will M. et al.: "Fully automated structure elucidation—A spectrocopist's dream comes true". Journal of Chemical Information and Computer Sciences, American Chemical Society, vol. 36, 1996, pp. 221-227, XP002290864 Chapter "Discussion", Conclusion and outlock Figs. 2, 5, 6.

Czarnik A.W.: "Combinatorial" Analytical Chemistry, American Chemical Society. Columbus, US. Jun. 1, 1998, pp. 378A-386A, XP00856269 ISSN: 0003-2700, pp. 378A-382A, Figs. 1-3.

Rossé G. et al.: "Automated structure verification of small molecules libraries using 1D and 2D NMR techniques". Methods in Molecular Biology (Clifton, N.J.) United States, vol. 201, 2002, pp. 123-140, XP009034685 entire document.

* cited by examiner

METHOD OF VERIFYING THE SYNTHESIS OF ORGANIC MOLECULES USING NUCLEAR MAGNETIC RESONANCE SPECTROSCOPY

This application is a continuation of Ser. No. 09/888,596 filed on Jun. 26, 2001 now abandoned which is a continuation in part of Ser. No. 09/422,639 filed Oct. 22, 1999 now abandoned and claims Paris Convention Priority of DE 198 49 231.6 filed Oct. 26, 1998 the complete disclosure of which are all hereby incorporated by reference.

BACKGROUND OF THE INVENTION

The invention relates to a method of verifying the synthesis of organic molecules using nuclear magnetic resonance spectroscopy. The method is particularly suited for use in libraries of compounds produced by combinatorial chemistry.

A large number of new organic compounds can be automatically synthesized from a smaller number of molecular structures using the techniques of combinatorial chemistry. These molecular structures contributing to the product are assigned a molecular structure code. Methods have been proposed for the subsequent verification of the success or failure of the synthesis (see for example "COMBINATORIAL" by A. W. Czarnik, Analytical Chemistry News & Features, pages 378 A to 386 A, 1 Jun. 1998).

Combinatorial chemistry methods aim at synthesizing compounds using a small number of chemical reactants in all combinations defined by a given reaction scheme to obtain a large number of well-defined products. NMR methods can be used to verify synthesis of these products with high throughput. The assessment of the measured NMR spectra has been conventionally carried out "manually" and mainly intuitively by highly specialized chemists and has also been based on relatively inaccurate model calculations.

The purity control and structure verification of compound libraries produced by automated synthesis and combinatorial chemistry both play an essential role in the success of medicinal chemistry programs. High performance liquid chromatography (HPLC), mass spectrometry (MS) and liquid chromatography-mass spectrometry (LC-MS) techniques are generally accepted as the most appropriate means of characterization. Although these analytical methods are fast and easy to automate, they do not provide sufficient structural and quantitative data about the desired products.

Nuclear magnetic resonance (NMR) spectroscopy is the most informative analytical technique and is widely applied in combinatorial chemistry. However, an automated interpretation of the NMR spectral results is difficult. The interpretation can usually be supported by use of spectrum calculation and structure generator programs. Automated structure validation methods rely on $^{13}C$ NMR signal comparison using molecular structure/molecular-spectra correlated databases or shift prediction methods.

In view of these aspects of prior art, it is the object of the present invention to present an NMR method which permits rapid, reproducible and reliable verification of a large number of molecular compounds produced by combinatorial chemistry.

SUMMARY OF THE INVENTION

This object is achieved with a nuclear magnetic resonance (NMR) method for verifying a production of compounds within a library of organic compounds produced by combinatorial chemistry, wherein the organic compounds are generated by reacting a first class of first molecular structures with at least one additional second class of second molecular structures, the compounds in the library being prepared having known first and second molecular structure content, wherein a first common structure class designation and first individual structure index designations are assigned to each of the first molecular structures and a second common structure class designation and second individual structure index designations are assigned to each of the second molecular structures the method comprising the steps of:

a) selecting a subset of the library compounds which contains all of the first molecular structures and all of the second molecular structures;

b) measuring a multi-dimensional NMR spectrum of each individual compound in said subset;

c) adding and subtracting NMR spectra of individual compounds in said subset to generate a combined NMR spectrum for each of said first and said second molecular structures, each of said combined NMR spectra having enhanced intensity contributions from one of said first and said second structures;

d) uniquely assigning a signal group in said combined NMR spectra to individual ones of said first and said second molecular structures and to said associated first and second structure classes and indices;

e) measuring a multi-dimensional NMR spectra of a sample which may contain an organic compound of the library other than those organic compounds used in the compound subset;

f) examining said NMR spectra taken in step e) for a presence of all uniquely assigned signal groups;

g) if said examining of a particular NMR spectrum indicates a presence of first and second molecular structures from said first and said second class corresponding to a particular organic compound of the library, characterizing that compound as TRUE; and h) repeating steps e) through g) on differing samples until all desired organic compounds in the library have been examined.

The sequence of the method steps is preferably carried out in the above-mentioned order, but may proceed in a reasonably modified different order. For example, correlation of signal groups in the NMR spectra to individual structures may be effected on the basis of previously obtained information, even prior to step a).

The advantages of the inventive method are now illustrated with an example of a three component reaction. Such a three component reaction involves linking three classes of molecule structures (building blocks) A, B, C to form a product compound denoted ABC. Each class may contain several molecular structures ($a_1, A_2 \ldots A_i$; $B_1, B_2 \ldots B_j$; $C_1, C_2 \ldots C_l$). With just 10 molecular structures in each class, 1000 different product compounds can be formed. Thus, the structures in the synthesized product compounds can be formally represented as a combination of individual molecular structures with one structure coming from each class. In many cases, a non-variable region (core) occurs in all library compounds. A structure code $A_xB_yC_z$ defined by the synthesis can be assigned to each product component. Both spectroscopic and chromatographic data can be regarded as the sum of data belonging to the individual molecular structures of a compound molecule.

Since synthesized product compounds can be formally represented as a combination of individual molecular structure fragments, 2D NMR spectra can be regarded as the sum of spectra of these structures. Through systematic examination of e.g. 2D C,H correlated NMR spectra the individual contributions of each molecular structure to the spectrum can be isolated into sub-spectra.

Once the spectral patterns of all individual molecular structures have been defined, all available spectra can be tested for the presence of a particular structure in the synthesized compounds. The proposed structure is verified (true) if all expected molecular structure fragments are found. If at least one of the expected patterns is not found, then the spectrum is not verified (false). Spectra with a low signal-to-noise ratio, or with large amounts of impurities are automatically assigned a "vague" category. In the simplest case, the verification procedure can be based on the integration of spectral patterns and comparison to an automatically detected noise level. Better results are obtained if a signal (e.g., from the core) can be defined as an internal reference signal to normalize all integrals. A reference spectrum is then defined for each molecular structure pattern. The corresponding integrals of these reference spectrum are defined as 100% and corresponding integral values of all other spectra are re-scaled accordingly. During the verification it is then possible to apply an additional threshold which expresses the minimum signal intensity of identified patterns. For example, a spectrum related to the structure code $A_1B_1C_1$ would be classified as true if $A_1$, $B_1$, and $C_1$ are identified and at least each integral exceeds 30%.

In a preferred variant of the inventive method, if a check of a particular compound yields the result that the signal group of at least one molecular structure contained in the compound molecule was not observed in the NMR spectra, this compound is characterized "false". In this manner, proper synthesis according to plan is characterized as "true" and those compounds where the synthesis did not work out, (at least not completely) are recognized through the absence of at least one of the molecular structure signal groups in the NMR spectrum.

In a further improvement, the NMR spectra are examined for a signal to noise ratio and/or a core signal intensity and a combination of molecular structures is characterized as "vague" if the signal to noise ratio or the core signal intensity is less than a certain threshold value.

The classification of "vague" is generally given when too little substance was available in the sample for the measuring time, leading to poor signal to noise ratios. For spectra exhibiting a core, "vague" results can be associated with core signal intensities which are below a certain threshold value.

Since the subset of individual compounds is generally considerably smaller than the entire library of all possible combinations, the checking of the NMR spectra for the remaining combinations can be considerably accelerated. Clearly, the prerequisite therefore is that a unique assignment of each molecular structure contained in the compound subset to a signal group is actually possible. If this should not be the case, the subset has to be augmented and a new attempt for unique assessment must be pursued. Only when the assignment is unique, can all remaining NMR spectra be checked for the signal groups determined with the assistance of the subset to verify synthesis of the remaining compounds in the library.

A further embodiment of a preferred variant of the method is characterized in that the subset is derived through modification of a subset of compounds used in a previous measurement series. Using previous results and assignments as a guide, a new subset of compounds can be selected which is more likely to meet the criterion of a unique assignment of signal groups to the individual molecular structures.

The number of compounds in the subset is preferably minimized by grouping molecular structures into classes having identical or similar chemical behavior. The smallest possible number of compounds in the subset is equal to the number of molecular structures in the largest class.

The assignment of signal groups in the NMR spectra of the subset compounds to the individual molecular structures can also be carried out manually. In this case, no special assessment software is required. Alternatively, the assignment is preferably carried out automatically via computer, which is considerably faster than "manual assessment". Costly personnel are not required for the actual assessment and the verification is carried out objectively, in a reproducible fashion, and largely error-free.

In a further preferred variant of the inventive method, the assignment of signal groups to the molecular structures is carried out using NMR spectra from a previous measurement series and/or on the basis of theoretically calculated spectral data. Using preexisting information, the assessment can be accelerated by using a selected subset of structure combinations and the assignment of signal groups to the structures can be carried out directly.

The organic molecules to be synthesized are preferably of low molecular weight, in a molecular weight range of approximately 100 u to approximately 2000 u. This is a mass range which is preferred in combinatorial chemistry. There are sufficient numbers of molecular structures in this mass range for carrying out the NMR measurements. Furthermore, two-dimensional NMR spectra are still relatively easy to analyze in this molecular weight range.

The synthesized organic compound molecules preferably contain a section referred to as a "core" present in all molecules of the library which can be consequently characterized in the NMR spectra by a common signal group and used as an internal reference for normalizing intensities. The core may be added prior to synthesis as an independent reactant, wherein the other structures couple thereto. Alternatively, a core can be formed in a coupling range of the initial molecular structures themselves, as a common section of the compound.

The core is preferable a molecular structure having between two and six chemical coupling points. In this case, the possible number of combinations remains sufficiently clear. Moreover, a multitude of commercial substances can be used as a core with this kind of core sub-structure.

In a particularly preferred further development of the method, the molecular structures in a class of structures are assigned to a respective common coupling point of the core.

The number of structures should be considerably greater than three to make a combinatorial approach reasonable at all.

The NMR spectra are preferably two-dimensional, 13C/1H correlated spectra (e. g. HSQC spectra=hetero nuclear single quantum coherence, see e.g. J.Magn.Reson. B108, pages 94–98 (1995)). Two-dimensional NMR spectra can be generated in rather short measuring times on the order of minutes with a resolution which is substantially better than that of one-dimensional spectra only. The multi-dimensional NMR spectrum preferably comprises signals stemming from coupling between $^1H$ and $^{13}C$ nuclei. In this way, the two most important atomic species of organic chemistry are included.

The assignment of signal groups in the NMR spectra to the individual molecular structures can be carried out particularly easily by formal addition and subtraction of normalized spectra of the associated structure codes. In a computer automated application of the method, the corresponding data can be quickly processed in this manner with the assistance of cluster algorithms.

In order to reduce the information content of the NMR spectra to the essential relevant features, a further preferred variant of the method provides peak lists which are established from the multi-dimensional NMR spectra to define the signal groups.

In a particularly easy standard for the recognition of peaks, a data point of the multi-dimensional, preferably two-dimensional, NMR spectrum is recognized as a "peak" if its value is larger than those of the n neighboring data points, wherein e.g. $4 \leq n \leq 12$, preferably n=8.

In a preferred further development, neighboring peaks are combined into clusters and are assessed by means of cluster analysis, wherein one or more clusters are assigned to a given molecular structure as a signal group. In this manner, a two-dimensional definition of the signal groups is possible. This method is insensitive to the fine structure of the individual peaks, which can be neglected. The analysis of the cluster as such is described e.g. in K. -P. Neidig et al., Journal of Magnetic Resonance 89, pages 543 to 552 (1990).

In a particularly preferred further development, the method assigns a cluster surface to each cluster in the two-dimensional NMR spectrum (more generally: a hyper surface in a multi-dimensional spectrum) and a molecular structure is regarded as recognized if, for all cluster surfaces assigned thereto, the NMR signal integrated over the cluster surface exceeds a predetermined threshold value. In this way, a highly reliable pattern recognition of molecular structures in the NMR spectrum is possible.

The threshold value can be defined as a normalized constant. The threshold value is preferably chosen normalized to the integral of the NMR signal over cluster surfaces assigned to other structures. This enables normalization of the respective signal group and is particularly useful for a core molecular structure. The threshold value is then independent of the absolute intensities of the spectra.

In a further preferred variant of the method, a table is established to display the results of analysis of NMR spectra measured for the remaining compounds in the library, recording the molecular structures (columns) and whether they were recognized (+) or not (−). In three additional columns, the sum of the recognized molecular structures, a total assessment ("true" or "false", possibly "vague") and the required combined molecular structure code is indicated. In this manner, the total result of the combinatorial measuring series can be conveniently summarized.

Further advantages of the invention can be derived from the description and the drawing. The features mentioned above and below can be used individually or in any arbitrary combination. The embodiments shown and described are not to be understood as exhaustive enumeration but rather have exemplary character for illustrating the invention.

The invention is shown in the drawing and is further explained by means of an embodiment.

BRIEF DESCRIPTION OF THE DRAWING

FIG. 4 $A_2+B_1+C_1$;
FIG. 5 $A_2+B_1+C_3$;
FIG. 6 $A_2+B_2+C_3$;
FIG. 7 $A_1+B_2+C_2$;

DESCRIPTION OF THE PREFERRED EMBODIMENT

Chemical compounds of a combinatorial series are particularly useful for automatic or at least partially automatic interpretation, since the signals of the structures in the combinatorial series can be separated formally into a core module, which is identical for all members of the series, and into a few variable module classes which are varied systematically via a limited number of structural fragment species in the class.

Figure 1A:
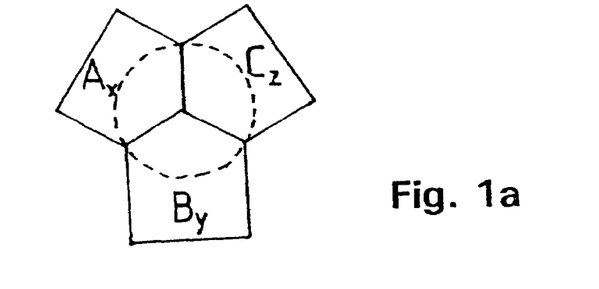
FIG. 1a shows a schematic representation of an organic molecular compound formed from the molecular structures $A_X+B_Y+C_Z$ wherein the structures form a common core.

FIG. 1a shows such a compound in a highly schematic fashion. The combined organic molecule consists of three molecular structures $A_X$, $B_Y$ and $C_Z$ which form a common core section in the range of their mutual connections (dashed lines in FIG. 1a).

Figure 1B:
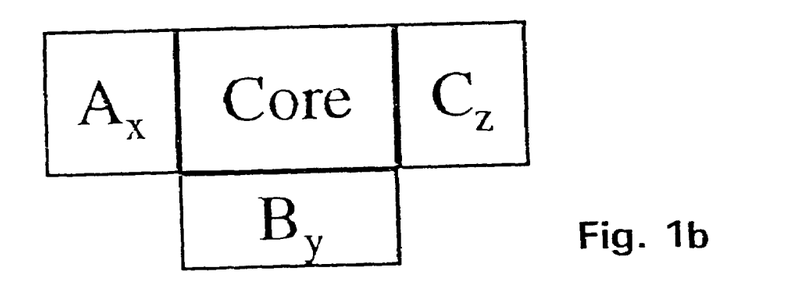
FIG. 1b shows a schematic representation of an organic molecular compound formed from the structures $A_X+B_Y+C_Z$ and a core molecule.

FIG. 1b shows an alternative in which the combined organic compound is formed with its own core molecular structure and having three attached molecular structures $A_X$, $B_Y$ and $C_Z$. These compound molecules can be described by structure codes which consist of a structure class with a corresponding structure index $A_X$, $B_Y$ and $C_Z$ etc. The indices x, y, z each represent a species or structure and are successive integers (1, 2, 3 . . .).

Figure 2:
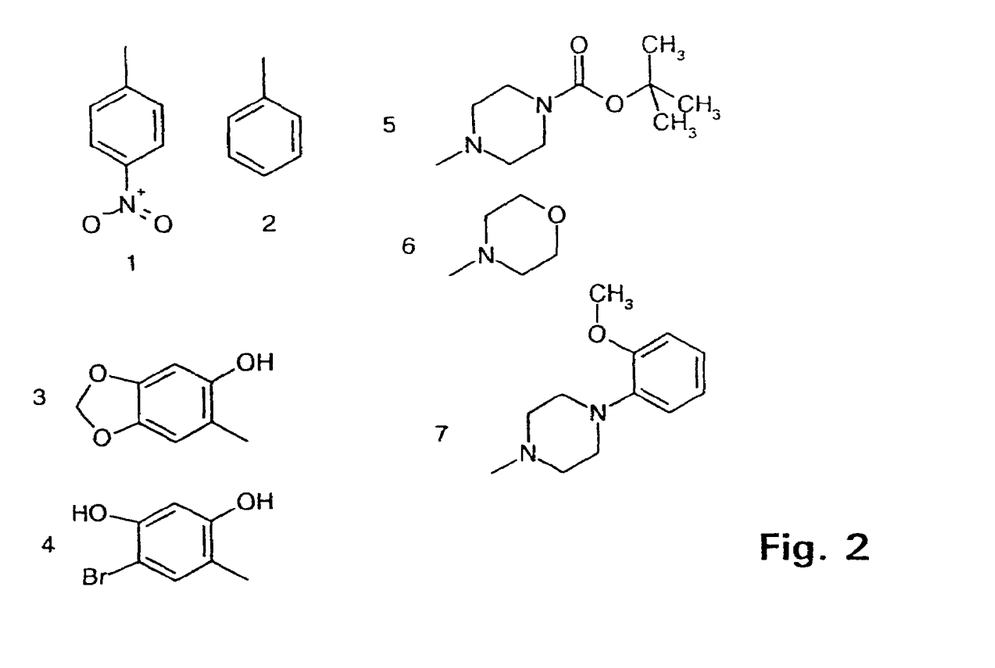
FIG. 2 shows the structures used in the spectra of FIGS. 3 to 7
Figure 3:
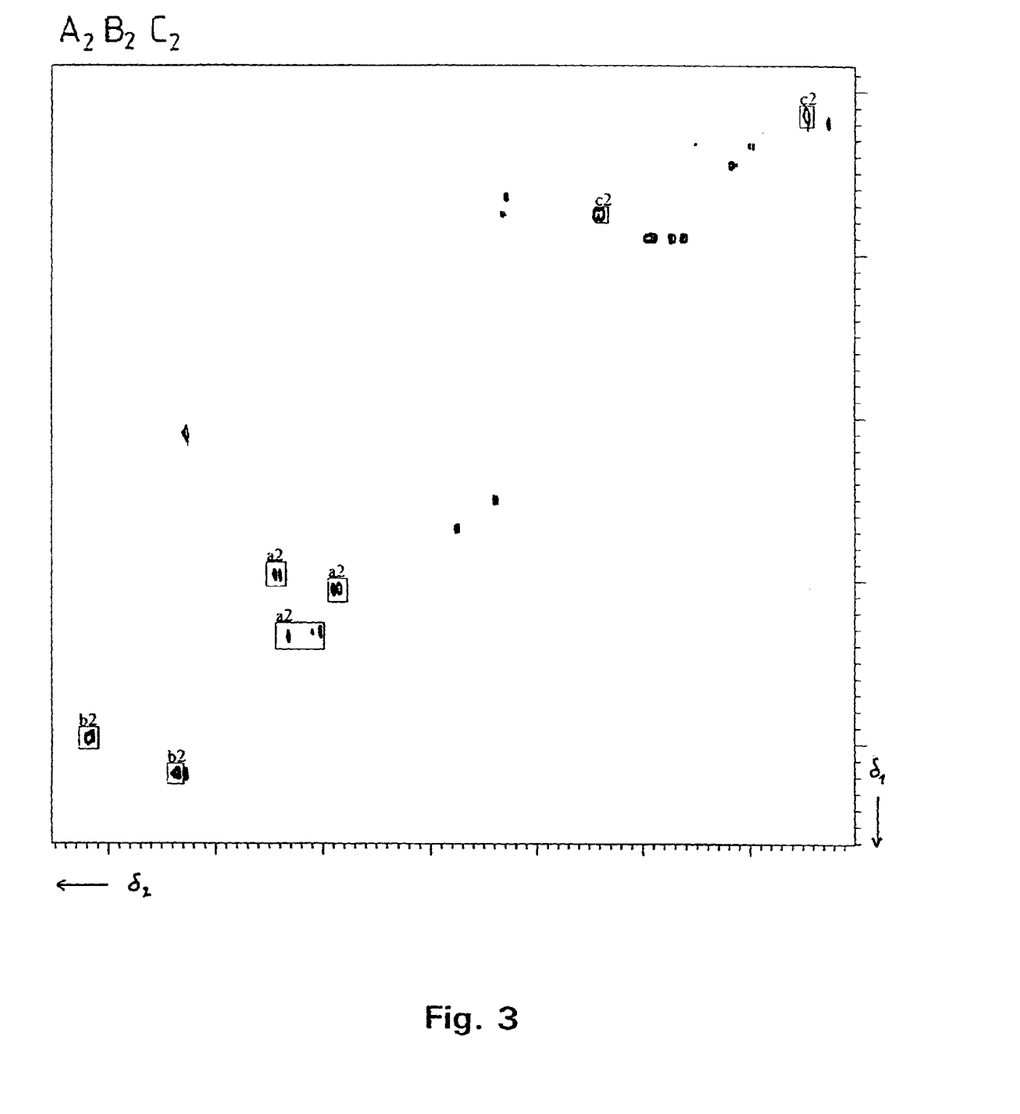
FIGS. 3 through 7 each show an NMR spectrum of a combination of three structures $A_X$, $B_Y$, $C_Z$ with a core molecule, namely FIG. 3 $A_2+B_2+C_2$.
Figure 4:
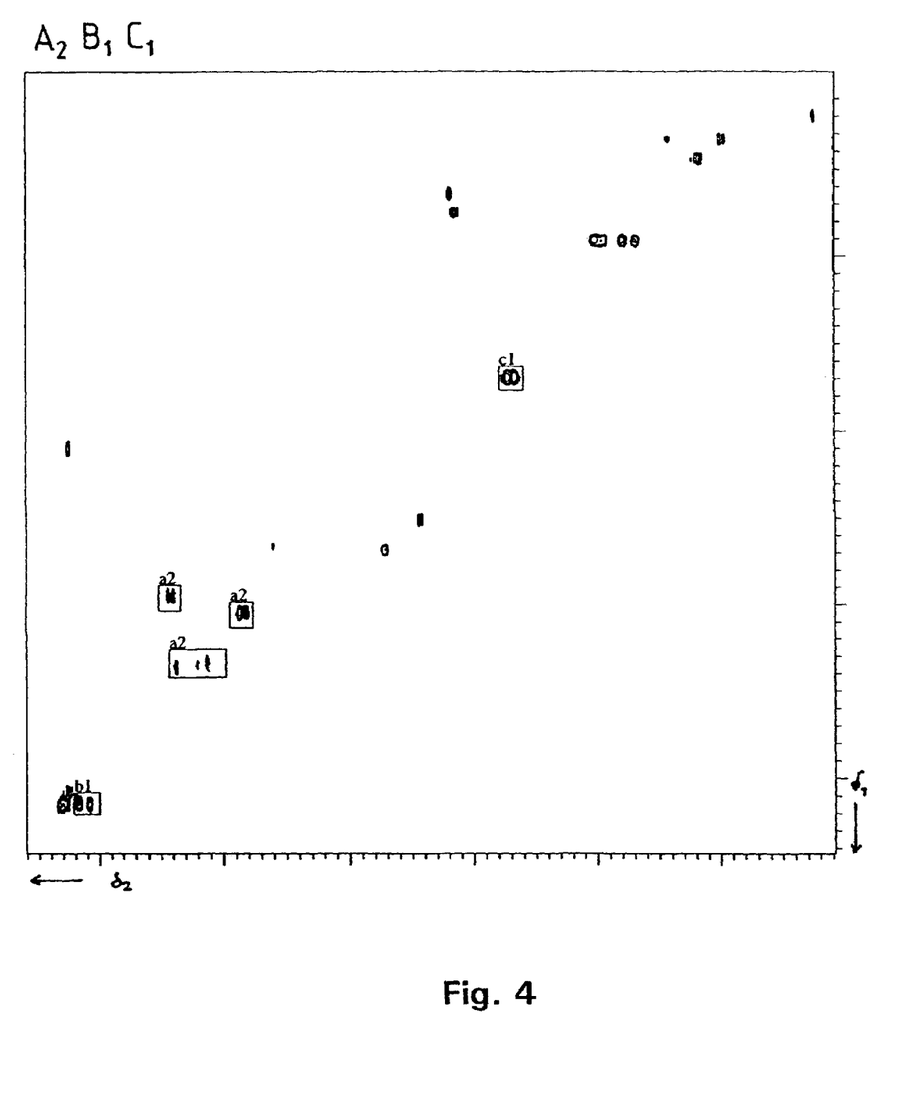
Figure 5:
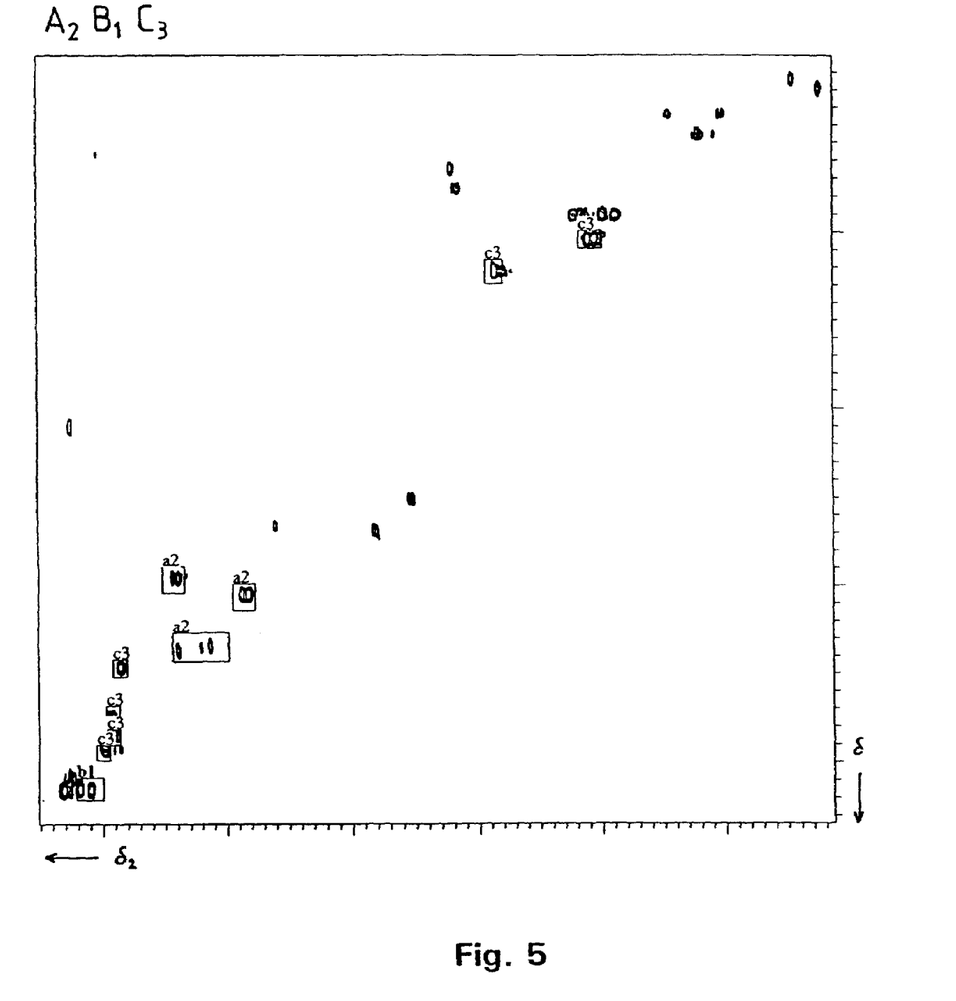
Figure 6:
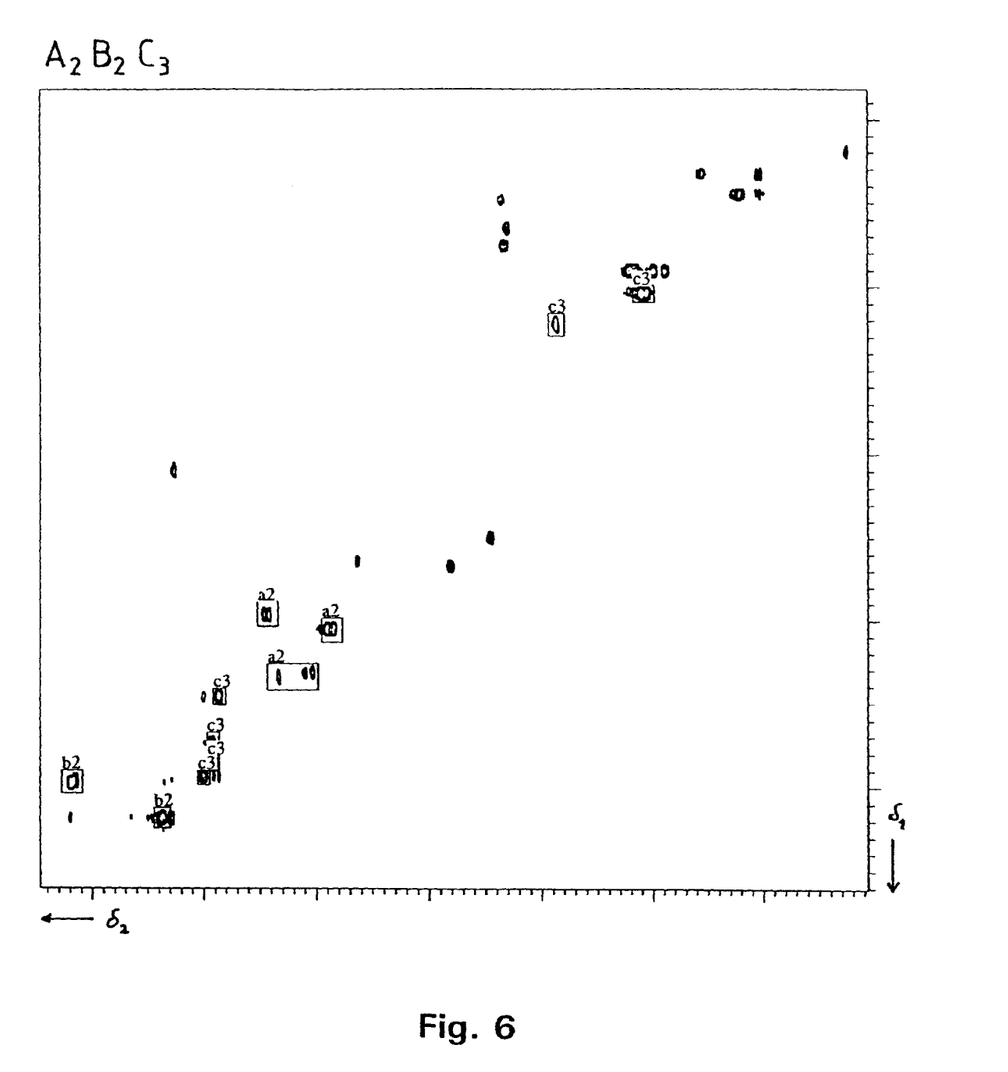
Figure 7:
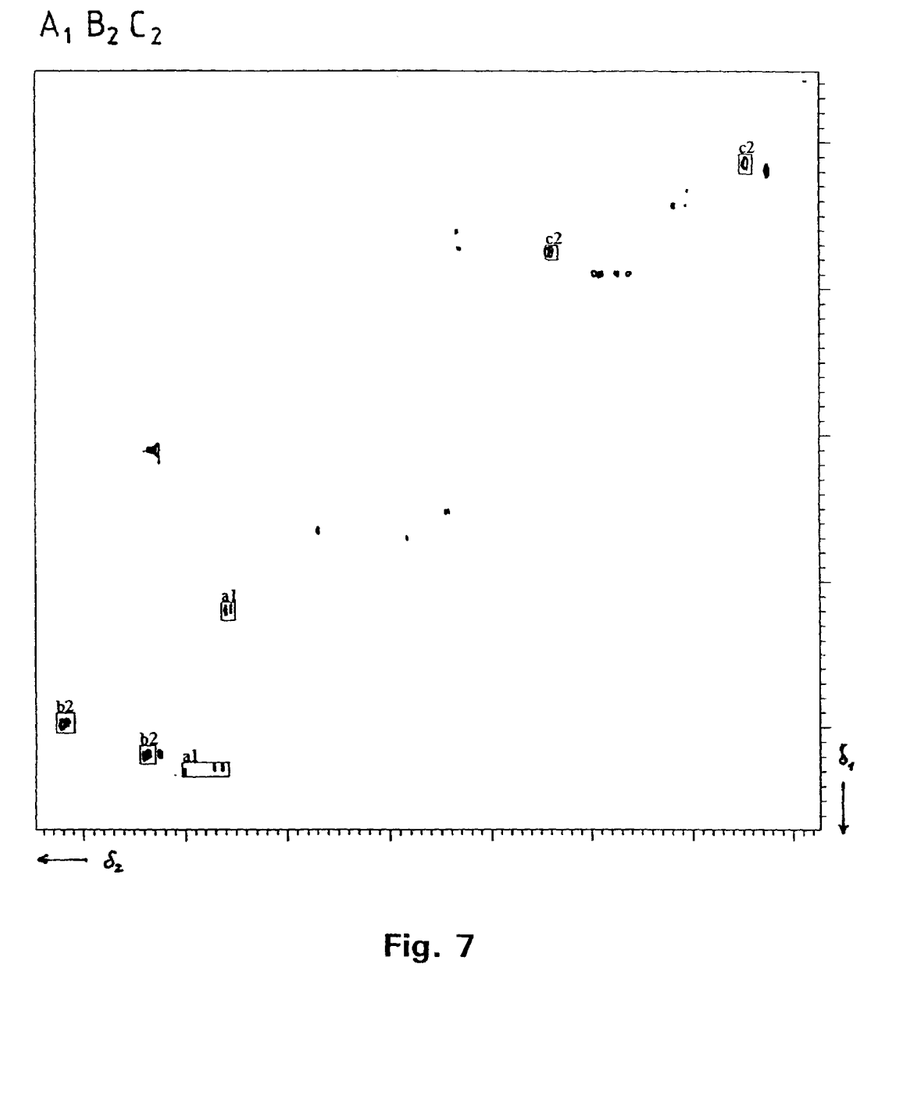

Such structure elements can be identified as signals or signal groups in two-dimensional HSQC spectra as shown below. The examples shown in FIGS. 3 to 7 are chemical substances represented in FIG. 2. Referring to FIG. 2 one can define:

(1) 4-nitrophenyl=B2
(2) phenyl=B1
(3) 3,4methylenedioxy-phenoxy=A2
(4) 3-hydroxy,4-bromo-phenoxy=A1
(5) tert-butyloxycarbonyl-piperazyl=C2
(6) morpholinyl=C1
(7) 2-methoxy-piperazyl=C3

The results of NMR experiments are shown in FIGS. 3 to 7. The spectra represent two-dimensional so-called HSQC (hetero nuclear single quantum coherence) experiments. Applied to protons and carbon (13C), the signals in those spectra show the correlation between carbon atoms and protons chemically bound thereto, i.e. the carbon signals in the direction δ1 and the proton signals in the direction δ2.

Identification of signal groups belonging to a certain molecular structure can be carried out manually or automatically. For automatic analysis, one performs formal algebraic additions and subtractions on the spectra associated with specific structure codes to isolate signals originating from a particular structure. For analysis purposes one can assign the value "1" to each structure present in a particular combination and use a threshold to extract a particular structure. Consider the following structure combinations:

$A_2 \, B_2 \, C_2$
$A_2 \, B_1 \, C_1$
$A_2 \, B_1 \, C_3$
$A_2 \, B_2 \, C_3$
$A_1 \, B_2 \, C_2$

The addition of $A_2 \, B_1 \, C_3$
$A_2 \, B_2 \, C_3$ and subtraction of $A_2 \, B_2 \, C_2$
$A_2 \, B_1 \, C_1$
$A_1 \, B_2 \, C_2$ yields the following sums for the structures $A_1 = 1$
$A_2 = 0$
$B_1 = 0$
$B_2 = -1$
$C_1 = -1$
$C_2 = -2$
$C_3 = 2$ If one sets the threshold value at 2, only $C_3$ remains.

The general rule is as follows: Add all N structure codes which contain the desired sub-structure, subtract others, and set the threshold value to <=N (e. g. N/2).

This formal operation can be carried out in practice on peak lists obtained from the corresponding spectra. A data point is thereby recognized as a two-dimensional peak if its value is larger than each of its 8 nearest neighbors. Neighboring peaks can be combined by means of a cluster analysis which evaluates distances and intensities to form groups (clusters).

When a peak of a spectrum is added to the peaks of another spectrum, it is included in the associated list with an increase in intensity for all peaks which are within a predefined radius.

When a peak of a spectrum is subtracted from the peaks of another spectrum, it is removed from the respective list and the intensities of all peaks which are within a predefined radius are reduced.

The result is a list of peaks which originate from the signals of the desired structure. Since these signals may be slightly different in various spectra, the peaks appear several times and in groups. The groups or clusters are determined by a cluster analysis.

The signals obtained for the desired structure are represented by small rectangles in the spectra, with each rectangle containing exactly one cluster. The width and height of these areas correspond to the expected variations of the signals in the given set of spectra.

When the remaining spectra are checked, integration of all structures is carried out. (Summation of all corresponding data points). Furthermore, for each spectrum, a pre-defined area which does not contain any signals is integrated and a noise value is calculated therefrom. The noise value is subtracted from all integrals.

Signals of the "core" structure can be defined as a reference and integrated separately. The integral ratios between all areas of all structures can also be calculated.

A structure is regarded as recognized if all of its areas have an integration value >0. A structure can also be regarded as recognized if all its areas exceed a defined integration value, compared to a reference value.

A molecular structure could also be regarded as recognized if all ratios of the integrals of all of its areas to the integrals of all other areas of all other structures exceed a defined value.

In the embodiment of FIGS. 2 through 7, x=2, y=2 and z=3. This results in 2×2×3=12 possible combinatorial combinations ($A_X \, B_Y \, C_Z$). The minimum subset for correlating the signals of each structure would have to comprise at least three molecules to assure that $C_1$, $C_2$ and $C_3$ are all present.

The results of the measurements is summarized in the following table:

| | Combinations | | | | |
|---|---|---|---|---|---|
| | $A_2B_2C_2$ | $A_2B_1C_1$ | $A_2B_1C_3$ | $A_2B_2C_3$ | $A_1B_2C_2$ |
| $A_1$ | − | − | − | − | + |
| $A_2$ | + | + | + | + | − |
| $B_1$ | − | + | + | − | − |
| $B_2$ | + | − | − | + | + |
| $C_1$ | − | + | − | − | − |
| $C_2$ | + | − | − | − | + |
| $C_3$ | − | − | + | + | − |
| Core | + | + | + | + | + |
| Sum | 4 | 4 | 4 | 4 | 4 |
| Result | + | + | + | + | + |

FIGS. 8 to 13 illustrate results for another library.

Figure 8:
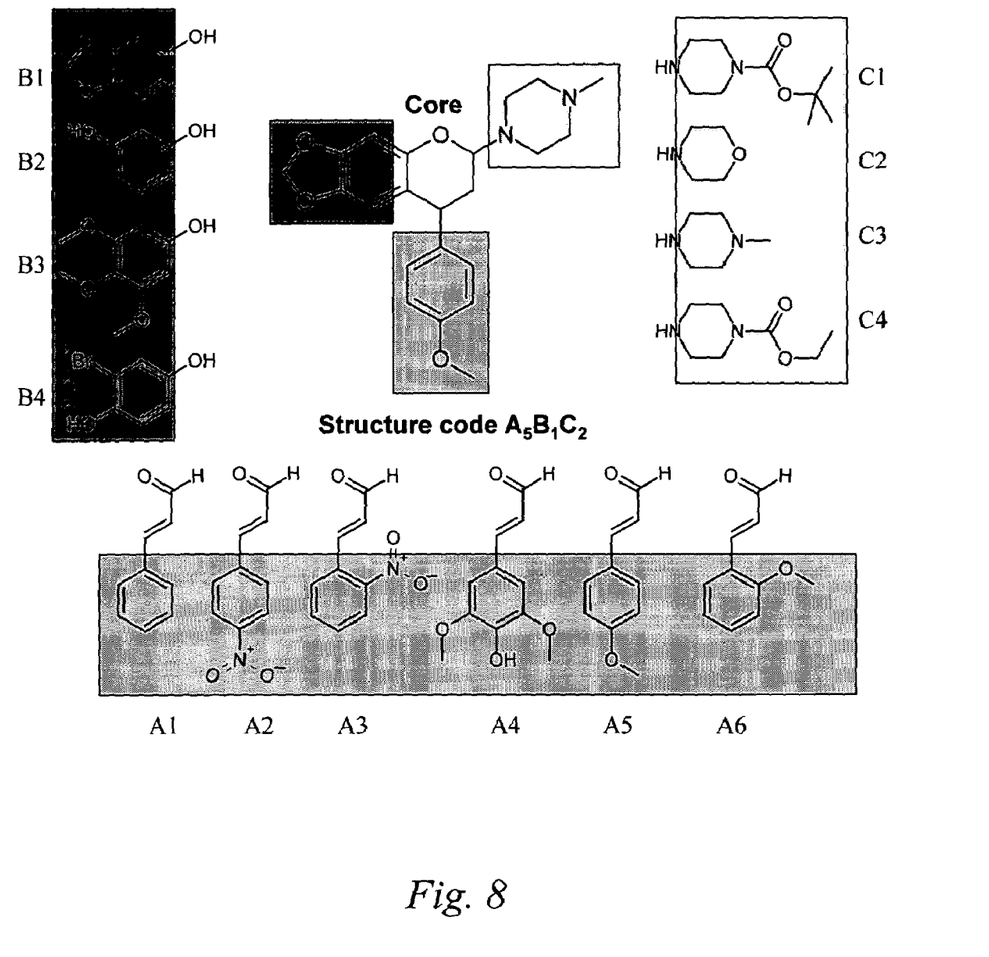
FIG. 8 shows a second example of the invention, having a library of ninety-six 4-phenylbenzopyrans generated in a three component reaction.

FIG. 8 shows ninety-six 4-phenylbenzopyrans generated in a three component reaction. For x=6, y=4 and z=4, x×y×z=96 different compounds with the structure codes $A_x B_y C_z$ are obtained. Library 1 is characterized by x+y+z+core=15 different structural fragments and a subset of six of the ninety-six compounds contain all structural fragments (e.g. $A_1B_1C_1$, $A_2B_2C_2$, $A_3B_3C_3$, $A_4B_4C_4$, $A_5B_1C_3$ and $A_6B_2C_4$).

Figure 9:
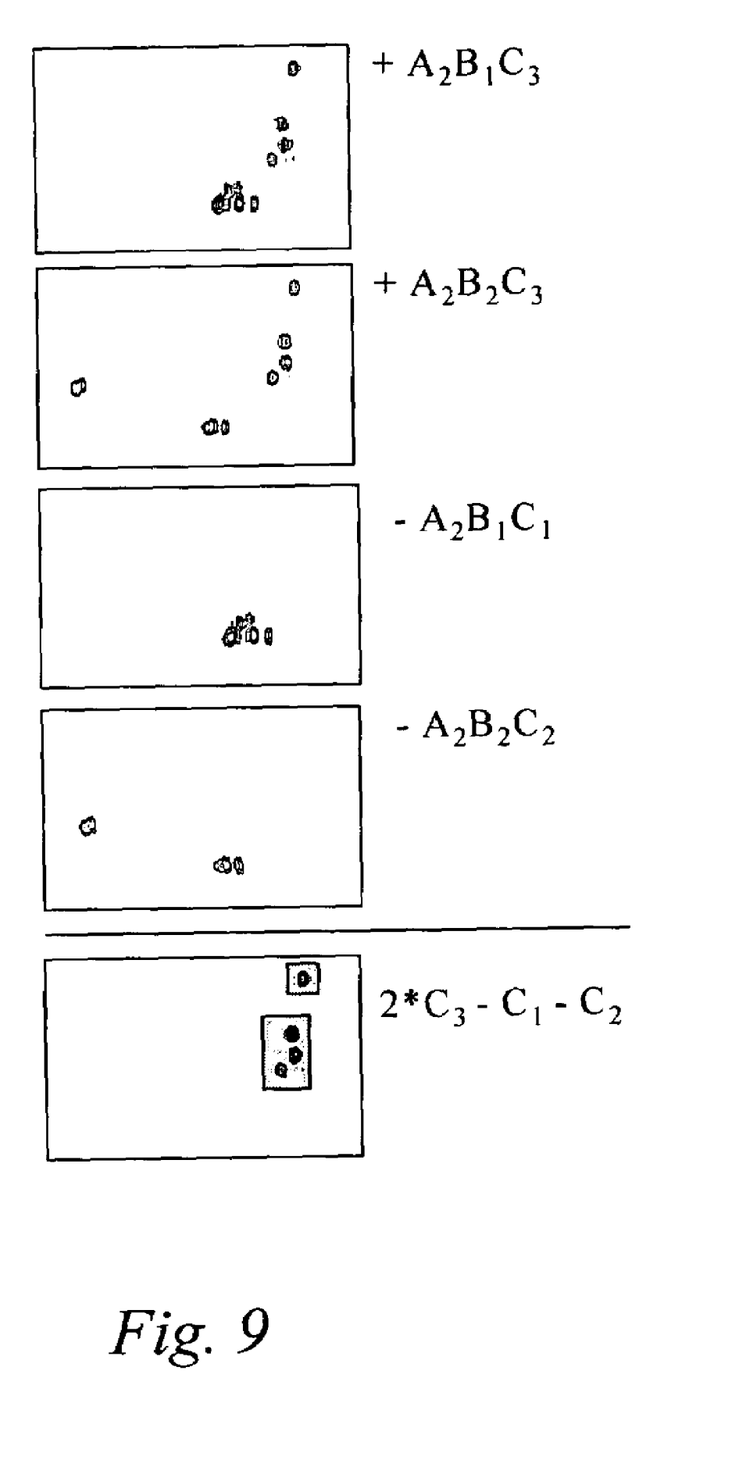
FIG. 9 shows how linear combinations of spectra can be used to extract pattern box $C_3$.

FIG. 9 illustrates a linear combination of spectra to extract pattern box $C_3$. Signals are peak picked and transformed into peak areas. Overlapping peak areas of spectra containing the structural fragment code $C_3$ are added (counted) and peak areas of spectra not containing $C_3$ are subtracted. The threshold is adjusted so that only peak areas of $C_3$ remain, and after a clustering step, boxes are defined for each remaining peak area.

Figure 10:
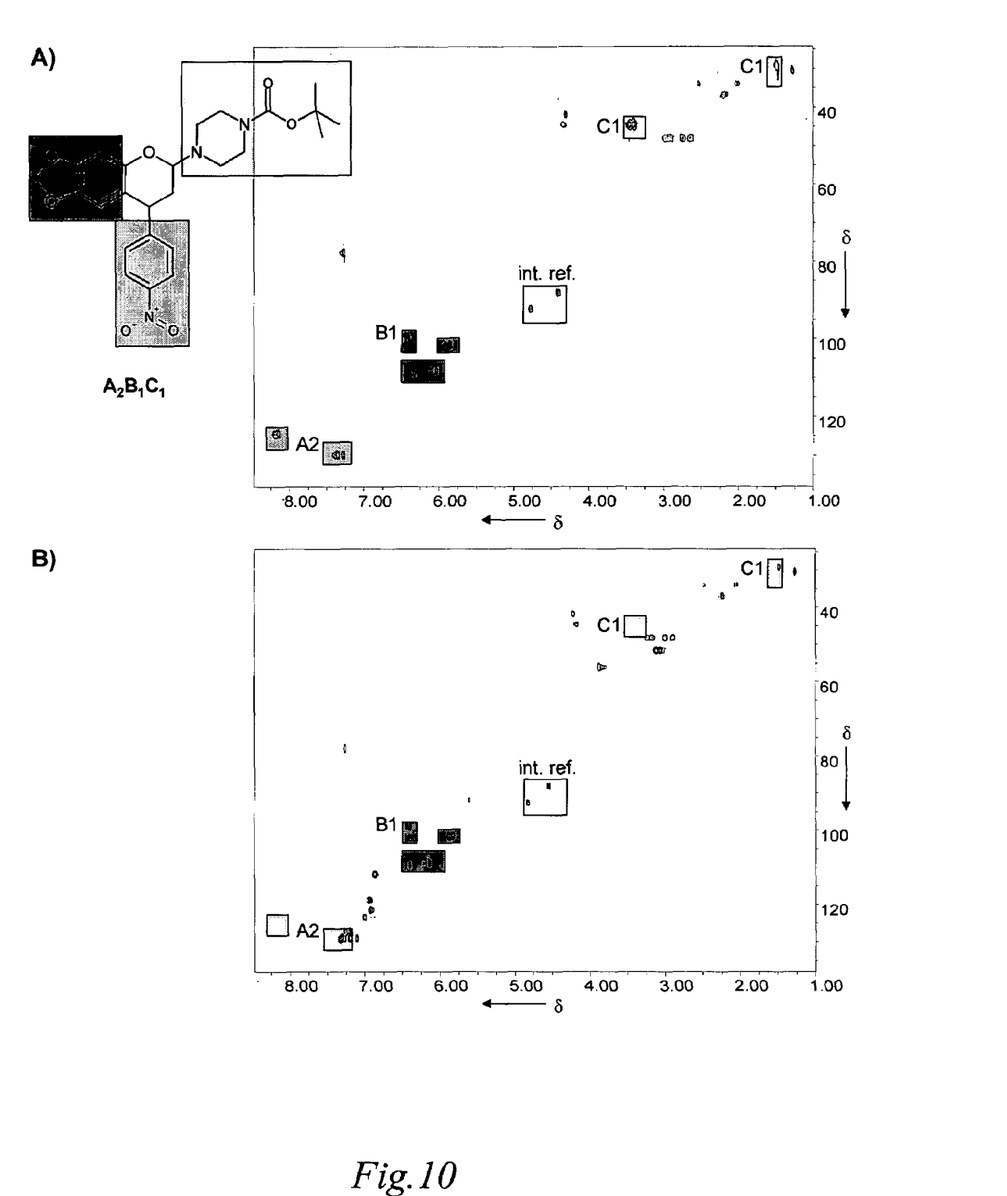
FIG. 10 shows decomposition of a 2D HSQC spectrum of a compound into subspectra corresponding to each of the three molecular structure fragments $A_2$, $B_1$, and $C_1$.

FIG. 10 illustrates decomposition of a 2D HSQC spectrum of a compound into sub-spectra corresponding to each of the three molecular structure fragments $A_2$, $B_1$, and $C_1$. The width and height of the boxes indicate the expected range of chemical shift for the signals of a given fragment. A spectral pattern is defined by the combination of the corresponding boxes. In FIG. 10A the spectral patterns of each fragment are found and the structure of the expected compound $A_2B_1C_1$ is therefore validated. In FIG. 10B the structure of compound $A_2B_1C_1$ is not verified because the spectral patterns of both $A_2$ and $C_1$ are missing.

Figure 11:
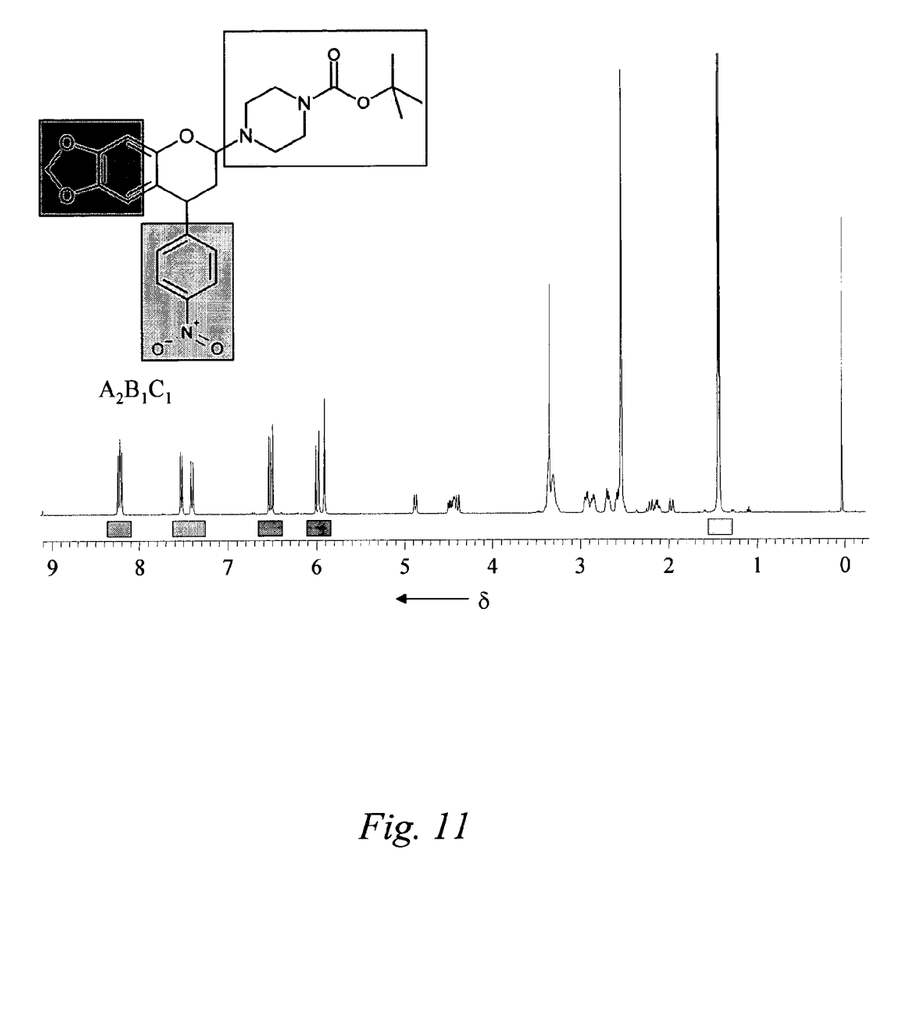
FIG. 11 shows a 1D spectrum of a synthesis product.

FIG. 11 shows a 1D spectrum of a synthesis product. Different signals are related to different molecular fragments.

Figure 12:
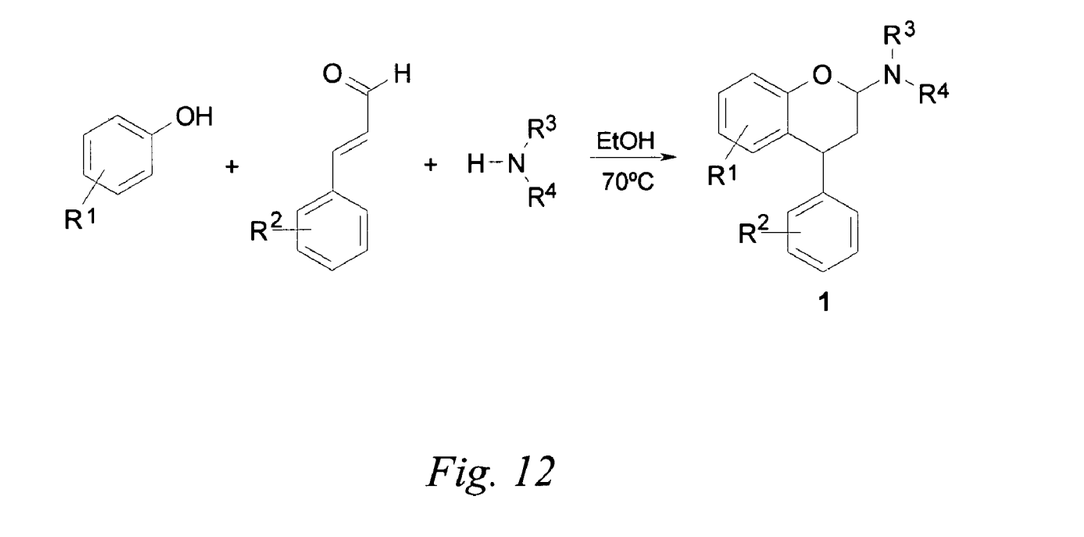
FIG. 12 illustrates synthesis of 4-phenylbenzopyran library 1.

FIG. 12 illustrates synthesis of 4-phenylbenzopyran library 1.

Figure 13:
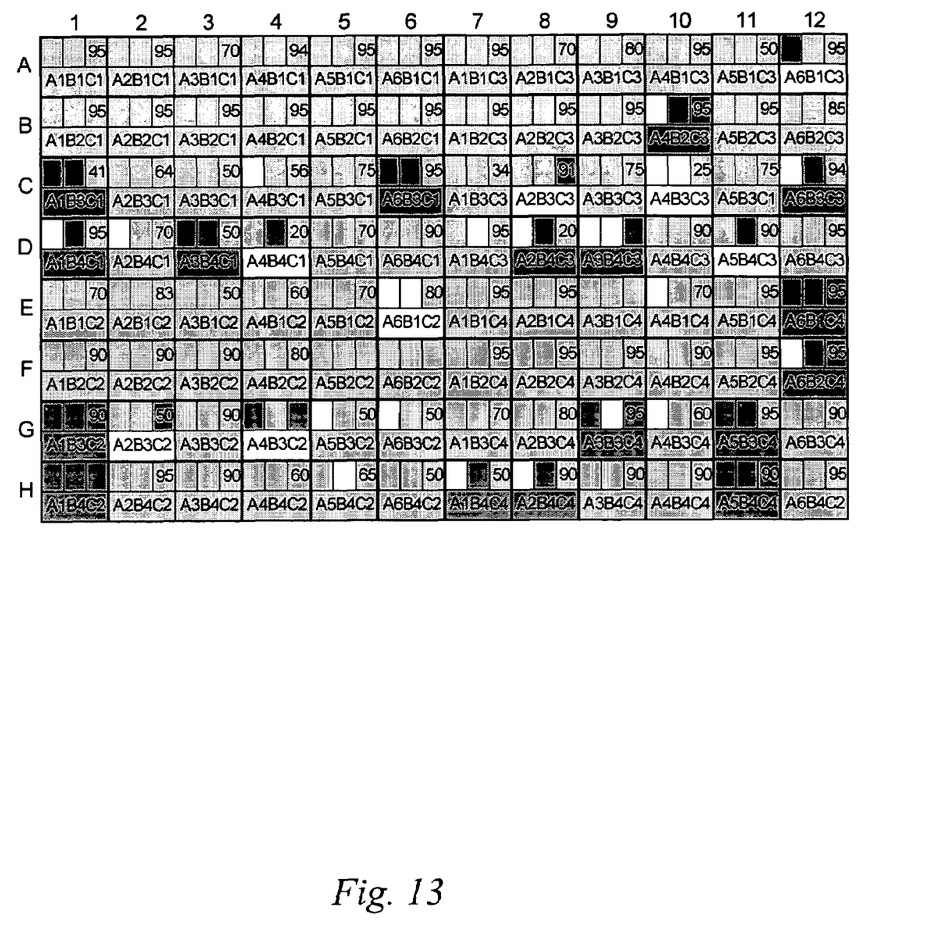
FIG. 13 illustrates results of automated NMR analysis in accordance with the invention in comparison to ESIMS, and HPCL analysis.

FIG. 13 illustrates results of the automated NMR method of the invention in comparison to an ESIMS, and HPLC analysis. Each cell contains the expected structure code, the final assignment, and the data for NMR (top left), ESIMS (top middle), and HPLC (top right). Light gray coloration means that the proposed structure is "true" in NMR, gives the expected molecular ion in ESIMS, and shows the expected retention time in HPLC. Dark grey means that the proposed structure is "false" following NMR, does not give a diagnostic molecular ion in ESIMS, or the retention time differs from the expected one. White is given for "vague" results in both NMR and ESIMS. HPLC purity is given in % (top right). Combined results are given in the structure code field (light grey: "true", dark grey: "false", white: "vague"). The classification "true" of the HPLC analysis was not taken into consideration for the final assignment. Contradictory results lead to the final category "vague". Eighteen compounds were not obtained by the synthesis procedure (B10, C1, C6, C12, D1, D3, D4, D8, D9, E12, F12, G1, G9, G11, H1, H7, H8, H11).

The 4-phenylbenzopyran library 1 was synthesized using a multi-component reaction by the combination of phenols, unsaturated aldehydes and secondary amines (FIG. 12). The products were purified before analysis. The $^1$H NMR and 2D HSQC spectra of the ninety-six 4-phenyl-benzopyrans were measured using standard NMR probes (5-mm) within sixteen hours.

The software analysis of the spectra includes the following steps:
1. Enter into the software:
   a) list of codes for the possible molecular structure fragments involved in the combinatorial reaction
   b) construct the paths to the recorded spectra and the associated structure codes.
2. Perform calculation step to define the integration boxes for each molecular structure fragment. The outputs are boxes assigned to each fragment.
3. Perform calculation step to determine appropriate reference spectra.
4. Perform calculation step to integrate all spectra. As an output a graphical display in table format, optionally using three colors (red, green, and yellow) to characterize the samples is shown and a textual result list is written on disk.

The following table summarizes verification results for the example of FIGS. 8 through 13.

In the columns labeled with fragment codes, the "+" and "−" entries indicate whether or not the corresponding spectral pattern was identified in a given spectrum. The column labeled NMR results indicates whether the structure is verified (+), false (−) or vague (?). For example, for compound $A_1B_3C_2$ pattern $A_1$, $B_2$, and $C_2$ were identified and the compound was assigned false. In this case the sample has been exchanged and the correct structure code would be $A_1B_2C_2$.

We claim:

1. A nuclear magnetic resonance (NMR) method for verifying a production of compounds within a library of organic compounds produced by combinatorial chemistry, the organic compounds generated by reacting a first class of first molecular structures with at least one additional second class of second molecular structures, with the compounds in the library being prepared having known first and second molecular structure content, wherein a first common structure class designation and first individual structure index designations are assigned to each of said first molecular structures and a second common structure class designation and second individual structure index designations are assigned to each of said second molecular structures, the method comprising the steps of:
   a) selecting a subset of library compounds which contains all of said first molecular structures and all of said second molecular structures;
   b) executing a two dimensional NMR pulse sequence to generate, after completion of the pulse sequence, a two dimensional NMR spectrum of each individual compound in said subset;
   c) adding and subtracting linear combinations of the NMR spectra resulting from step b) of individual compounds in said subset to generate an individual combined NMR spectrum for each of said first and said second molecular structures, each of said individual combined NMR spectra having enhanced intensity contributions from only one of said first and said second structures;
   d) uniquely assigning a signal group in said combined NMR spectra to individual ones of said first and said second molecular structures and to the associated first and second structure classes and indices;
   e) executing a two dimensional NMR pulse sequence to generate, upon completion of the pulse sequence, two dimensional spectra of a sample to examine an organic compound of the library other than those organic compounds used in the compound subset;
   f) analyzing said NMR spectra taken in step e) for a presence of all uniquely assigned signal groups;

| NMR result | $A_1$ | $A_2$ | $A_3$ | $A_4$ | $A_5$ | $A_6$ | $B_1$ | $B_2$ | $B_3$ | $B_4$ | $C_1$ | $C_2$ | $C_3$ | $C_4$ |
|---|---|---|---|---|---|---|---|---|---|---|---|---|---|---|
| $A_1B_1C_1$ | + | + | − | − | − | − | + | − | − | − | + | − | − | − |
| $A_1B_2C_1$ | + | + | − | − | − | − | − | + | − | − | + | − | − | − |
| $A_1B_3C_1$ | − | + | − | − | − | − | − | − | + | − | + | − | − | − |
| $A_1B_4C_1$ | ? | + | − | − | − | − | − | − | − | + | + | − | − | − |
| $A_1B_1C_2$ | + | + | − | − | − | − | + | − | − | − | − | + | − | − |
| $A_1B_2C_2$ | + | + | − | − | − | − | − | + | − | − | − | + | − | − |
| $A_1B_3C_2$ | − | + | − | − | − | − | − | + | − | − | − | + | − | − |
| $A_1B_4C_2$ | − | + | − | − | − | − | − | − | − | + | − | − | − | − |
| $A_2B_1C_1$ | + | − | + | − | − | − | + | − | − | − | + | − | − | − |
| $A_2B_2C_1$ | + | − | + | − | − | − | − | + | − | − | + | − | − | − | g) if said analyzing of a particular NMR spectrum indicates a presence of first and second molecular structures from the first and said second class corresponding to a particular organic compound of the library, characterizing that compound as TRUE; and h) repeating steps e) through g) on differing samples until all desired organic compounds in the library have been examined.

2. The method of claim 1, wherein should step g) indicate that at least one of said signal groups of said first and said second molecular structures of a particular organic compound has not been observed, that particular compound is characterized to be FALSE.

3. The method of claim 2, further comprising the step of examining, prior to steps g) and h), said NMR spectra for at least one of a signal to noise ratio and a core signal intensity and characterizing a compound as VAGUE if at least one of said signal to noise ratio and said core signal intensity is less than a threshold value.

4. The method of claim 1, further comprising expanding said subset of compounds to include additional individual compounds if steps a) to d) indicate failed synthesis of one or more desired individual compounds.

5. The method of claim 1, wherein the organic compounds have molecular weights in a range from 100 u to 2000 u.

6. The method of claim 2, wherein the organic compounds have molecular weights in the range from 100 u to 2000 u.

7. The method of claim 1, wherein a common core is present in all compounds.

8. The method of claim 3, wherein a common core is present in all compounds.

9. The method of claim 7, wherein said core is a molecular structure with between 2 and 6 binding sites.

10. The method of claim 1, wherein a number of first and second molecular structures is between 5 and 500.

11. The method of claim 1, wherein said two dimensional NMR spectrum is a two-dimensional $^1$H and $^{13}$C correlated spectrum.

12. The method of claim 1, wherein said assignment of signal groups in said combined NMR spectra to individual molecular structures is achieved by formal addition and subtraction of normalized structure codes.

13. The method of claim 1, wherein a spectral region of said two dimensional NMR spectrum is recognized in step g) to be a peak if its intensity is larger than that of n neighboring equal sized data regions, wherein $4 \leq n \leq 12$.

14. The method of claim 13, wherein neighboring recognized peaks are combined into clusters and are analyzed by means of cluster analysis, wherein one or more clusters are assigned to certain molecular structures as said signal group.

15. The method of claim 14, wherein a cluster area is assigned to each cluster inside a two-dimensional NMR spectrum and wherein a particular molecular structure is recognized to be identified if an NMR signal, integrated over said cluster area, is greater than a predetermined limit for all cluster areas assigned to said particular molecular structure.

16. The method of claim 15, wherein said limit is a ratio to an integral of NMR signal over cluster areas which are assigned to other molecular structures.

17. The method of claim 1, wherein the library comprises three classes of molecular structures.

18. The method of claim 8, wherein said core is used as an internal reference for normalizing intensities.

19. The method of claim 1, wherein said two dimensional NMR spectra are heteronuclear single quantum coherence spectra.

* * * * *